(12) United States Patent
Kato

(10) Patent No.: US 10,818,518 B2
(45) Date of Patent: Oct. 27, 2020

(54) METHOD FOR MANUFACTURING MODULE COMPONENT

(71) Applicant: Murata Manufacturing Co., Ltd., Nagaokakyo-shi, Kyoto-fu (JP)

(72) Inventor: Noboru Kato, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 0 days.

(21) Appl. No.: 16/204,299

(22) Filed: Nov. 29, 2018

(65) Prior Publication Data

US 2019/0096701 A1 Mar. 28, 2019

Related U.S. Application Data

(63) Continuation of application No. PCT/JP2017/028205, filed on Aug. 3, 2017.

(30) Foreign Application Priority Data

Aug. 9, 2016 (JP) ................................. 2016-156908

(51) Int. Cl.
*H01L 21/56* (2006.01)
*H01L 23/00* (2006.01)
(Continued)

(52) U.S. Cl.
CPC .......... *H01L 21/568* (2013.01); *H01L 21/561* (2013.01); *H01L 23/12* (2013.01);
(Continued)

(58) Field of Classification Search
CPC . H01L 21/568; H01L 23/49827; H01L 24/96; H01L 24/97; H01L 2221/6834;
(Continued)

(56) References Cited

U.S. PATENT DOCUMENTS 5,353,498 A   10/1994   Fillion et al.
5,497,033 A    3/1996   Fillion et al.
(Continued)

FOREIGN PATENT DOCUMENTS

JP    H077134 A       1/1995
JP    2003017859 A    1/2003
(Continued)

OTHER PUBLICATIONS

International Search Report issued for PCT/JP2017/028205, dated Oct. 24, 2017.
(Continued)

*Primary Examiner* — Alia Sabur
(74) *Attorney, Agent, or Firm* — Arent Fox LLP

(57) ABSTRACT

A plurality of surface mounting components are arranged on a component mounting surface of a transfer substrate. A resin layer is formed on the transfer substrate and the plurality of surface mounting components are buried in the resin layer. The resin layer is peeled off the transfer substrate, with the plurality of surface mounting components buried in the resin layer, to expose a surface resin layer. An intermediate auxiliary layer is provided on the exposed surface of the resin layer. The intermediate auxiliary layer has openings to expose respective mounting terminals of the surface mounting component. Metal materials are arranged in the openings. A wiring sheet which includes a thermoplastic resin sheet with an electrode pattern and a plurality of unmetallized via patterns is joined to the intermediate auxiliary layer so that each of the via patterns aligns with a respective one of the openings in the intermediate auxiliary layer. Heat treatment is performed to fuse the thermoplastic resin sheet to the intermediate auxiliary layer and to metallize the via patterns to connect the via patterns to the openings in the intermediate auxiliary layer and therefore
(Continued)

the mounting terminals and the electrode pattern through the metal materials and the via patterns.

13 Claims, 17 Drawing Sheets

(51) Int. Cl.
*H01L 23/498* (2006.01)
*H01L 23/538* (2006.01)
*H01L 23/12* (2006.01)
*H01L 23/31* (2006.01)
*H01L 23/552* (2006.01)

(52) U.S. Cl.
CPC .... *H01L 23/3114* (2013.01); *H01L 23/49822* (2013.01); *H01L 23/49827* (2013.01); *H01L 23/5389* (2013.01); *H01L 23/552* (2013.01); *H01L 23/562* (2013.01); *H01L 24/19* (2013.01); *H01L 24/96* (2013.01); *H01L 24/97* (2013.01); *H01L 2224/04105* (2013.01); *H01L 2224/24137* (2013.01); *H01L 2224/24195* (2013.01); *H01L 2924/3025* (2013.01); *H01L 2924/3511* (2013.01)

(58) Field of Classification Search
CPC ......... H01L 24/19; H01L 2224/24225–24226; H01L 2924/3511
See application file for complete search history.

(56) References Cited

U.S. PATENT DOCUMENTS

| | | | |
|---|---|---|---|
| 6,680,441 B2 | 1/2004 | Kondo et al. | |
| 2002/0147264 A1* | 10/2002 | Takeuchi | C08K 3/04 524/495 |
| 2002/0192442 A1 | 12/2002 | Kondo et al. | |
| 2003/0019662 A1* | 1/2003 | Higuchi | H05K 3/4069 174/250 |
| 2004/0256734 A1* | 12/2004 | Farnworth | H01L 21/561 257/777 |
| 2009/0065245 A1* | 3/2009 | Hsu | H01L 23/49822 174/260 |
| 2012/0313253 A1* | 12/2012 | Nakadaira | H01L 21/561 257/774 |
| 2013/0217184 A1* | 8/2013 | Ishizuki | H01L 21/568 438/110 |
| 2014/0231126 A1* | 8/2014 | Hunrath | H05K 3/4614 174/264 |
| 2016/0141268 A1 | 5/2016 | Nakamura et al. | |
| 2017/0110415 A1 | 4/2017 | Nakamura et al. | |
| 2017/0133310 A1* | 5/2017 | Kelly | H01L 23/49816 |

FOREIGN PATENT DOCUMENTS

| | | | | |
|---|---|---|---|---|
| JP | 2012188555 A | * | 10/2012 | ............. H01L 24/96 |
| JP | 2012231182 A | | 11/2012 | |
| JP | 2016100389 A | | 5/2016 | |
| KR | 20170070779 A | * | 6/2017 | |
| WO | 2014196296 A1 | | 12/2014 | |
| WO | 2016080116 A1 | | 5/2016 | |

OTHER PUBLICATIONS

Written Opinion of the International Search Report issued for PCT/JP2017/028205, dated Oct. 24, 2017.

* cited by examiner

FIG. 13
FIG. 13(1)
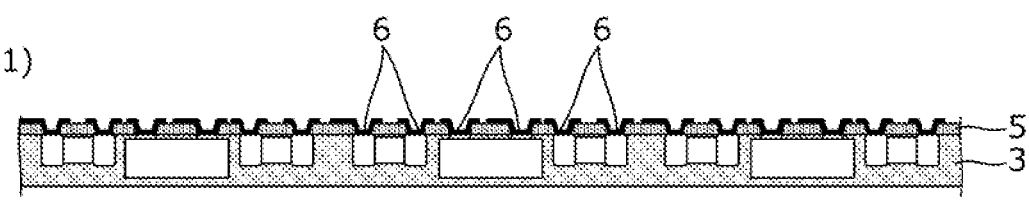
FIG. 13(2)
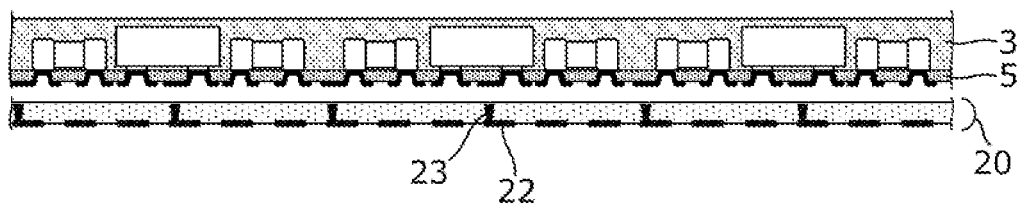
FIG. 13(3)
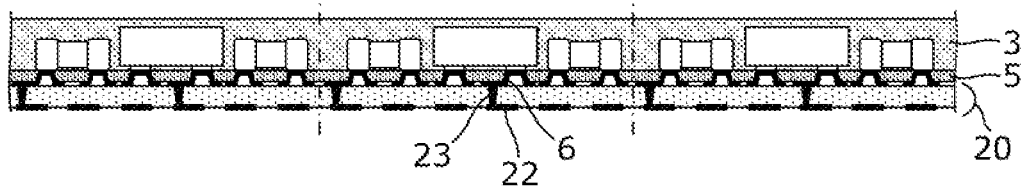

METHOD FOR MANUFACTURING MODULE COMPONENT

CROSS REFERENCE TO RELATED APPLICATIONS

The present application is a continuation of International application No. PCT/JP2017/028205, filed Aug. 3, 2017, which claims priority to Japanese Patent Application No. 2016-156908, filed Aug. 9, 2016, the entire contents of each of which are incorporated herein by reference.

BACKGROUND OF THE INVENTION

Field of the Invention

The present invention relates to module components incorporated in an electronic device, and more particularly to a method for manufacturing a module component suitable for high integration or miniaturization.

Description of the Related Art

Various module components are generally configured by soldering a surface mounting component for configuring a predetermined circuit on a module substrate.

Although miniaturization of each part of the constituent elements is important for high integration or miniaturization of a module component, as will be described below, a determining factor of an outer shape size of the module component has recently shifted from a wiring density of a module substrate to a size of a component to be mounted on the module substrate, a size of a component mounting land, and a distance between components to be arranged.

In other words, thinning and multi-layering of the wiring are possible if a multilayer substrate is used as the module substrate, and in this respect, a ceramic multilayer substrate or a resin multilayer substrate having a high wiring density has already been put to practical use. On the other hand, in a soldering method for a surface mounting component, solder flash, explosion, distortion of the module substrate and reduction in dimensional accuracy due to preprocessing of the module substrate are likely to occur, and thus in view of such, a minimum inter-component distance of 0.15 mm is required.

Here, as disclosed in Japanese Unexamined Patent Application Publication No. 2012-231182, a module component that does not require a soldering step is known. In this process, components that have been arranged on a supporting body are embedded in a resin layer, and an insulating layer and a wiring layer are stacked on the component built-in layer, that is, the soldering step for mounting components on the substrate is not required, whereby the distance between the surface mounting components can be reduced.

However, in the process disclosed in Japanese Unexamined Patent Application Publication No. 2012-231182, the component built-in layer is obtained by curing epoxy resin or the like, and thus the component built-in layer warps after peeling the supporting body due to residual stress by the curing of resin. Therefore, the coplanarity of the component built-in layer becomes unstable, and it becomes difficult to build up the insulating layer and the wiring layer on the surface of the component built-in layer. Particularly when the component built-in layer is made larger, the tendency appears prominently.

Accordingly, an object of the present invention is to provide a method for manufacturing a module component that can efficiently manufacture a module component suited for high integration or miniaturization.

BRIEF DESCRIPTION OF THE INVENTION

In accordance with an aspect of the invention, a module component is formed as follows. A plurality of surface mounting components are arranged on a component mounting surface of a transfer substrate. Each of the surface mounting components has a mounting terminal facing the component mounting surface of the transfer substrate. A resin layer is formed on the component mounting surface of the transfer substrate and the plurality of surface mounting components are buried in the resin layer. The resin layer is peeled from the transfer substrate, with the buried surface mounting components inside, to expose a surface of the resin layer. An auxiliary layer is formed on the exposed surface of the resin layer. The intermediate auxiliary layer includes openings for exposing the mounting terminals and there are metal materials arranged in the openings. A wiring sheet which includes a thermoplastic resin sheet with a plurality of unmetallized via patterns and an electrode pattern connected to the via patterns is joined to the intermediate auxiliary layer such that each of the via patterns aligns with a respective one of the openings in the intermediate auxiliary layer. Heat treatment is performed to fuse the thermoplastic resin sheet to the intermediate auxiliary layer and to metallize the via patterns to connect the via patterns to the openings in the intermediate auxiliary layer. As a result, the mounting terminals and the electrode pattern are electrically connected.

In preferred embodiments, the intermediate auxiliary layer is a layer of thermoplastic resin, the metal materials are a material having copper as a main component and the via patterns in the unmetallized state are defined by a metal material capable of forming an intermetallic compound with copper.

In some embodiments of the invention, the thermoplastic resin sheet includes a plurality of thermoplastic resin sheets which are stacked to configure the wiring sheet.

In the preferred embodiment, the transfer substrate, the resin layer, the intermediate auxiliary layer, and the wiring sheet include a plurality of module component forming regions together defining a module component aggregate and the module component aggregate is cut into individual modules.

In some embodiments, a warp preventing supporting material is attached to a surface of the resin layer before the resin layer is peeled from the transfer substrate. In one preferred embodiment, the warp preventing supporting material is a thermoplastic resin sheet. In another preferred embodiment, the warp preventing supporting material is an Si substrate.

In a preferred embodiment, the warp preventing supporting material is provided with an electrode for shielding before the warp preventing supporting material is attached to the surface of the resin layer.

In such an embodiment, it is preferred that the warp preventing supporting material be peeled from the resin layer after the wiring sheet has been joined to the intermediate auxiliary layer.

According to the present invention, the inter-component distance can be reduced, and a highly integrated or miniaturized module component can be obtained.

BRIEF DESCRIPTION OF THE DRAWINGS

FIGS. 13(1)-13(3) are cross-sectional views of a substrate and each layer in a predetermined step of the method for manufacturing another module component according to the third embodiment.

DETAILED DESCRIPTION OF THE INVENTION

Figure 1:
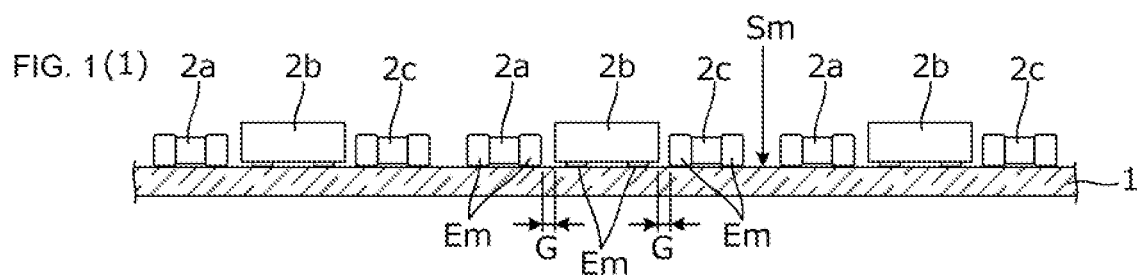
FIGS. 1(1)-3(12) are cross-sectional views of a substrate and each layer in each step of a method for manufacturing a module component according to a first embodiment.
Figure 1:
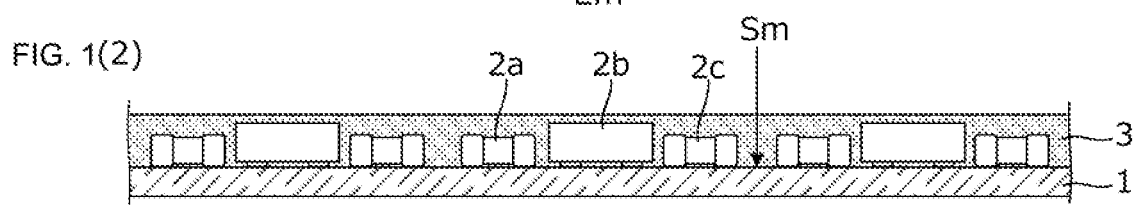
Figure 1:
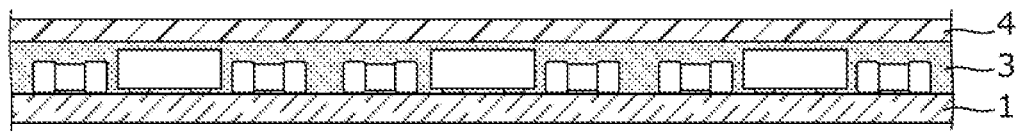
Figure 1:
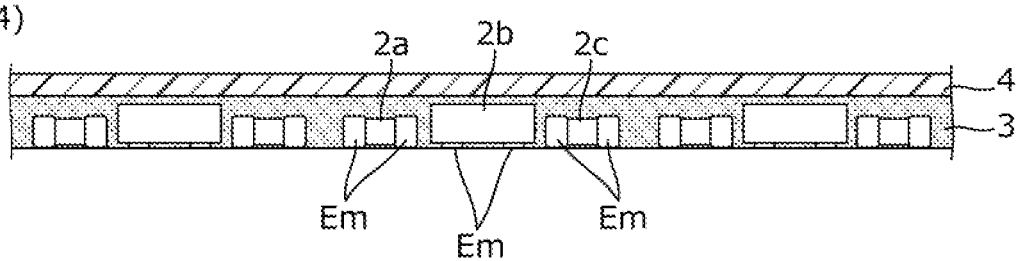

Hereinafter, several specific examples will be given with reference to the drawings to describe a plurality of embodiments of the present invention. Identical reference numerals are denoted on the same portions in each figure. In view of the description of the points or the ease of understanding, embodiments are shown separately for convenience, but partial substitutions or combinations of configurations shown in different embodiments are possible. In the second and subsequent embodiments, descriptions of matters common to those of the first embodiment are omitted, and only different points will be described. Particularly, similar operation and effect by similar configuration will not be referred to sequentially in each embodiment.

First Embodiment

Figure 2:
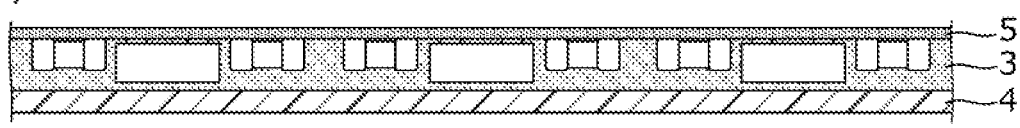
Figure 2:
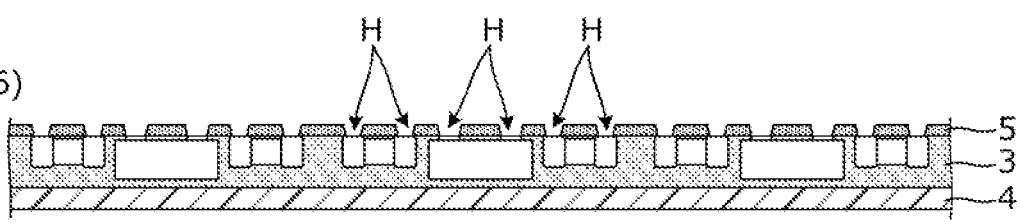
Figure 2:
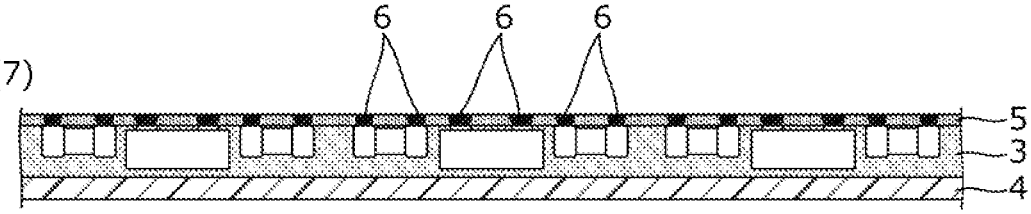
Figure 3:
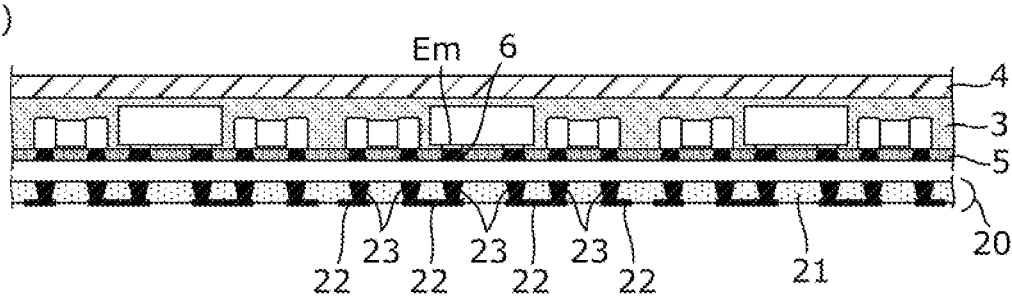
Figure 3:
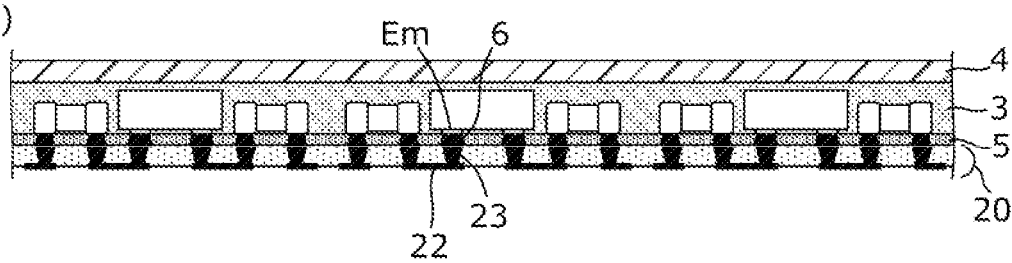
Figure 3:
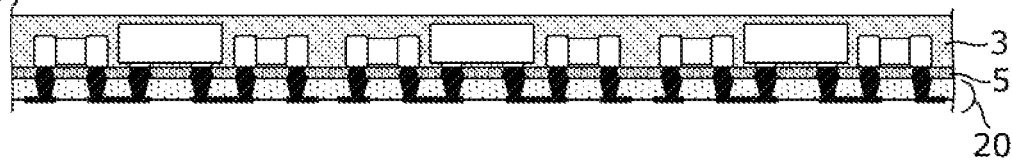
Figure 3:
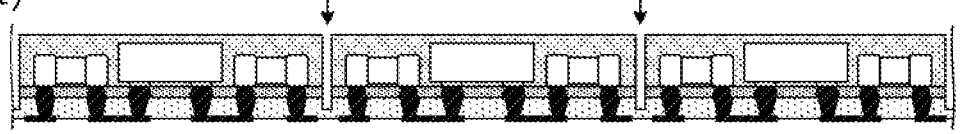
Figure 3:
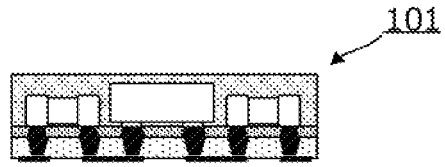

FIGS. 1, 2, and 3 are cross-sectional views of a substrate and each layer in each step of a twelve step method for manufacturing a module component according to a first embodiment (each successive step following the prior step). However, they are sectional views at a line not passing through each component, in which a cross section of each component does not appear.

Hereinafter, a method for manufacturing the module component 101 will be described in the order of these steps.

[Surface Mounting Component Arranging Step]

As shown in FIG. 1(1), surface mounting components 2a, 2b, 2c are arranged on a component mounting surface Sm of a transfer substrate 1. The surface mounting components 2a and 2c are preferably so-called dog-bone type chip components having a mounting terminal Em at both ends. The surface mounting component 2b is a semiconductor integrated circuit component having an LGA type input/output terminal such as an IC chip that includes a mounting terminal Em at a bottom surface thereof. Specifically, an adhesive is applied to the surface of the transfer substrate 1, and the surface mounting components (hereinafter, simply referred to as "components") 2a, 2b, and 2c are arranged on the transfer substrate 1 with the mounting terminals thereof facing the component mounting surface Sm of the transfer substrate 1. The components 2a, 2b, 2c are thereby temporarily fixed to the transfer substrate 1. The transfer substrate 1 is a substrate having high flatness and high rigidity such as, for example, an SUS substrate, an Si substrate, or the like. The Si substrate (silicon wafer) is preferable as the flatness is high. An adhesive layer may be provided in advance on the component mounting surface Sm of the transfer substrate 1. A general chip mounter may be used for arranging each surface mounting component on the transfer substrate.

An inter-component distance G is, for example, a narrow gap of smaller than or equal to 0.05 mm. According to the present embodiment, such a very narrow pitch mounted module component can be obtained.

[Surface Mounting Component Burying Step]

As shown in FIG. 1(2), the resin layer 3 is formed on the component mounting surface Sm of the transfer substrate 1, and the plurality of components 2a, 2b, 2c are buried in the resin layer 3. The resin of the resin layer 3 is, for example, an epoxy thermosetting resin. Specifically, the resin layer 3 is preferably formed by uniformly applying an uncured epoxy thermosetting resin by a spin coating method or the like and then performing heating and curing. The applying method may be a metering application method with a dispenser. Alternatively, UV curable resin may be applied and cured by UV irradiation. Each component may be buried using a semi-cured resin sheet.

[Warp Preventing Supporting Material Attaching Step]

As shown in (3) of FIG. 1, a warp preventing supporting material 4 is attached to the surface of the resin layer 3. This warp preventing supporting material 4 is a supporting plate that prevents the resin layer 3 incorporating the components from being warped when the transfer substrate 1 is removed, and is a base material having high flatness and high rigidity such as, for example, a Si substrate or the like.

[Transfer Substrate Peeling Step]

As shown in FIG. 1(4), the resin layer 3 is peeled off from the transfer substrate 1 together with the plurality of components. At this stage, the mounting terminal Em of each component 2a, 2b, 2c is exposed on the surface of the resin layer 3. For example, the surfaces of the mounting terminals Em of the components 2a and 2c, which are dog-bone type chip components, are preferably Sn plated. Furthermore, the surface of the mounting terminal Em of the component 2b such as an IC chip is preferably Au plated. Thus, by peeling off the transfer substrate 1 after attaching the warp preventing supporting material 4, the coplanarity of the terminal exposed surface of each surface mounting component is maintained and the accuracy of the terminal position of each surface mounting component is secured.

[Intermediate Auxiliary Layer Processing Step]

As shown in FIG. 2(5), an intermediate auxiliary layer 5 is provided on the peeling surface of the resin layer 3, that is, on the surface where the mounting terminal of each component is exposed. For example, polyimide resin is applied and formed so as to have a predetermined thickness of greater than or equal to 5 µm and smaller than or equal to 30 µm. Since various surface treatments such as Sn plating, solder plating, Au plating and the like are performed on the terminals of respective surface mounting components, in order to join the terminals of the surface mounting components to metal materials of a thermoplastic resin sheet, it is important (but not absolutely required) to perform the same electrode treatment such as Cu plating on the terminal electrodes of the surface mounting components and stabilize electrical joining between the mounting components and a wiring sheet portion. The intermediate auxiliary layer 5 has an advantageous effect of preventing attachment of the Cu plating and the like to the surface mounting component and enhancing the adhering force and the sealability of a component lower surface portion and a substrate portion by covering portions other than the terminal portion of each mounting component with resin. In particular, an edge portion of the chip of the chip size package IC, and a material such as ferrite and varistor tend to have plating easily attach to an element body, and hence such intermediate auxiliary layer process is necessary. In addition, the shapes of the terminals of the mounting components are not uniform, and the terminal positions of the respective surface mounting components in FIG. 2 are at the same height, but the heights from the terminal positions to the component lower surfaces are not uniform. In the present proposal, as a step of joining the resin layer 3 and a wiring sheet 20 (see FIG. 3(8)) in performing heating and pressurizing in a post-step is provided, breakage of the mounting component, occurrence of cracks, and the like due to excessive stress concentration can be avoided (or at least mitigated) by providing the intermediate auxiliary layer 5 at the lower part of the component.

Thereafter, as shown in FIG. 2(6), the intermediate auxiliary layer 5 is subjected to an exposure process and a development process to form openings H in the intermediate auxiliary layer 5 and expose the mounting terminal of each component. These openings H are preferably smaller than the terminal size of the surface mounting component. For example, the openings can have a circular shape having a diameter of greater than or equal to 0.01 mm and smaller than or equal to 0.1 mm.

Furthermore, as shown in FIG. 2(7), the opening H is filled with a metal material 6. For example, this can be achieved, for example, by forming a Cu plated film on the entire surface of the intermediate auxiliary layer 5 and performing etching on portions other than where the openings H are located. By way of a further example, instead of forming the Cu plated film, a Cu film may be formed by printing and applying a Cu paste.

A thermoplastic resin sheet obtained by filling a predetermined position with an unmetallized metal material may be used for the intermediate auxiliary layer 5. In this case, the joining of the thermoplastic resin sheet to the resin layer 3 and the joining of the mounting terminal of each component and the metal material are simultaneously enabled by attaching the thermoplastic resin sheet to the resin layer 3 and then performing heating and pressurizing.

[Wiring Sheet Joining Step]

As shown in FIGS. 3(8) and 3(9), a wiring sheet 20 is provided to overlap the surface provided with the intermediate auxiliary layer 5. The wiring sheet 20 is a sheet in which an electrode pattern 22 and a via pattern 23 are formed in the thermoplastic resin sheet 21. A method for manufacturing the wiring sheet will be described later.

Figure 4:
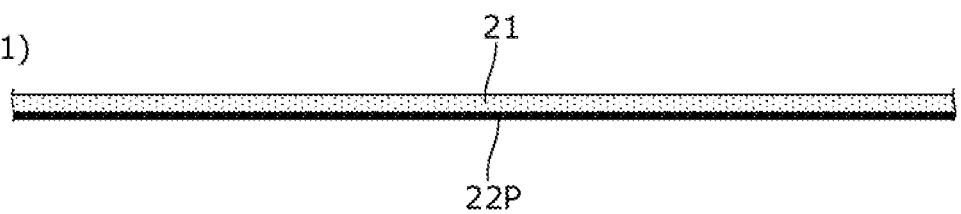
FIGS. 4(1)-4(4) are cross-sectional views in each step of a method for manufacturing a wiring sheet according to the first embodiment.
Figure 4:
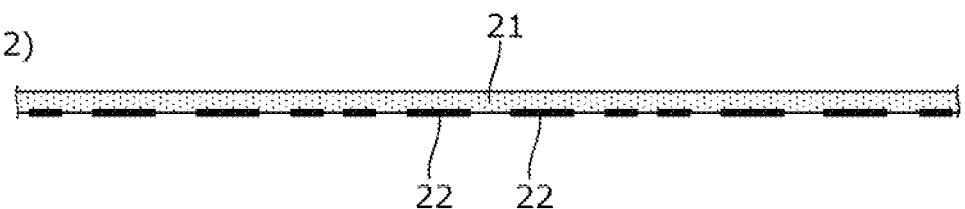
Figure 4:
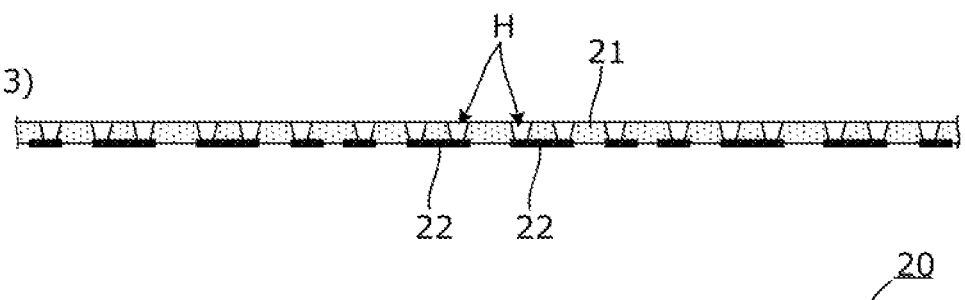
Figure 4:
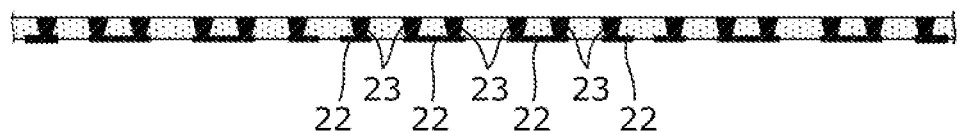

The thermoplastic resin sheet 21 (see FIGS. 4(1)-4(4) of the wiring sheet 20 is preferably fused to the intermediate auxiliary layer 5 by superposing the wiring sheet 20 on the intermediate auxiliary layer 5, and performing heating and pressurizing (heat treatment). The via pattern 23 of the wiring sheet 20 is in an unmetallized state before heat treatment. However, the via pattern 23 is metallized by the heat treatment and the mounting terminal Em of each component and the electrode pattern 22 are connected through the metal material 6 and the via pattern 23.

[Dividing Step]

As shown in FIGS. 3(10), 3(11), and 3(12), the warp preventing supporting material 4 is peeled off from the resin layer 3, a scribe line SL is formed on a stacked body of the resin layer 3, the intermediate auxiliary layer 5 and the wiring sheet 20 with a dicer, and the stacked body is divided into individual module components 101 by breaking. The stacked body may be divided with the dicer and the like without forming a scribe line.

[Wiring Sheet Producing Step]

The wiring sheet 20 shown in FIG. 3(8) is preferably independently formed separately from the processing steps for the resin layer 3 and the intermediate auxiliary layer 5.

FIGS. 4(1)-4(4) are cross-sectional views of each step (in order) of the preferred method for manufacturing the wiring sheet.

(1) First, a Cu foil 22P is laminated on a thermoplastic resin sheet 21 such as a liquid crystal polymer, a polyimide resin, and the like.

(2) The electrode pattern 22 is formed by patterning the Cu foil 22P by photolithography and the like.

(3) Openings H are formed in the thermoplastic resin sheet 21 at respective spaced positions to form vias by laser processing or the like.

(4) A conductive paste is filled in the openings H. The via pattern 23 in the unmetallized state is thereby formed. The conductive paste is, for example, a mixture of a metal component containing Sn powder and CuNi alloy powder, and a flux component containing rosin and an activator.

In the steps shown in FIGS. 3(8) and 3(9), the conductive paste constituting the via pattern 23 and the metal material 6 are joined by transient liquid phase diffusion (hereinafter referred to as "TLP") bonding. In other words, a CuNiSn alloy is generated and joined at an interface between the conductive paste constituting the via pattern 23 and the metal material 6. The heating temperature for the TLP reaction is higher than or equal to a melting point of the Sn and lower than or equal to a melting point of the CuNi alloy, and is, for example, 250° C. to 350° C. The CuNiSn alloy is an intermetallic compound and has a high melting point (for example, higher than or equal to 400° C.). Therefore, at the soldering temperature at the time of mounting the module components later, the joined portion by the CuNiSn alloy does not remelt.

Figure 5:
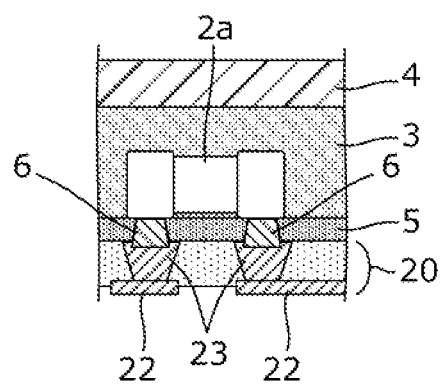
FIG. 5 is an enlarged cross-sectional view of a joining portion of a via pattern 23 and a metal material 6 according to the first embodiment.

FIG. 5 is an enlarged cross-sectional view of a joining portion of the via pattern 23 and the metal material 6. The width (the horizontal direction as viewed in FIG. 5) of the metal material 6 is smaller than the width of the via pattern 23, and the joining by the TLP reaction is performed in a state that a portion of the metal material 6 is buried in the via pattern 23. In other words, a structure in which a distal end portion of the metal material 6 partially enters the via pattern 23 is obtained. Therefore, the interface between the conductive paste constituting the via pattern 23 and the metal material 6 is wide, and the joining strength between the conductive paste and the metal material 6 is high. Furthermore, even if there is an error of a certain extent in the overlapping position of the resin layer 3 and the wiring sheet 20, the manufacturing of the module component of ultra-high density mounting is facilitated as the entire width of the metal material 6 is joined to the via pattern 23.

The wiring sheet 20 is manufactured by the above steps.

Figure 6:
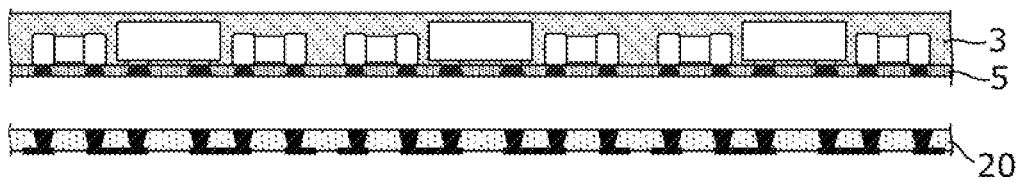
FIG. 6 is a cross-sectional view of the substrate and each layer in a predetermined step of the method for manufacturing another module component according to the first embodiment.

In the foregoing embodiment, and as best shown in FIG. 3(8), the wiring sheet 20 is placed in an overlapping position relative to the resin layer 3 while the warp preventing supporting material 4 is coupled to the resin layer 3. However, as shown in FIG. 6, it is possible to place the wiring sheet 20 in an overlapping position relative to the resin layer 3 in a state where the warp preventing supporting material 4 is not attached to the resin layer 3.

According to the present embodiment, a plurality of surface mounting components can be provided inside the module component without using solder. A module component of ultra-high density mounting in which the inter-component distance is, for example, smaller than or equal to 50 µm is obtained. Furthermore, since the module component is a sheet stacking type rather than a build-up type (thin film stacking type or thick film multilayer type), integration is enabled even if the component built-in layer (e.g., the resin layer 3) is warped or distorted. The present embodiment is also effective when a great number of module components are manufactured at once by a large-size process.

In addition, since the step after the transfer substrate peeling step is a step of forming the wiring by joining the wiring sheet, the wiring can be formed even if the resin layer including the plurality of surface mounting components is warped after the transfer substrate peeling step. In addition, since the metal materials are formed using the intermediate auxiliary layer, even if electrode materials of the mounting terminals of the surface mounting components are indeterminate, the mounting terminals are joined to the via patterns through the metal materials of the same electrode material. Moreover, even if materials of the terminal electrodes of respective surface mounting components are different from each other, the metal materials of the intermediate auxiliary layer 5 are the same material, and hence the wiring sheet 20 can be easily joined to the intermediate auxiliary layer 5. Furthermore, since the metallization of the via pattern in the unmetallized state and the fusion of the thermoplastic resin of the wiring sheet and the intermediate auxiliary layer are performed in the same step by the heat treatment in the wiring sheet joining step, manufacturing can be carried out with a small number of steps.

In addition, since the intermediate auxiliary layer is a thermoplastic resin, the intermediate auxiliary layer and the wiring sheet can be easily fused. Furthermore, since the thermoplastic resin of the wiring sheet and the intermediate auxiliary layer are fused, moisture resistance of the interface is secured.

Furthermore, a high warp preventing effect can be obtained by using, for example, a Si substrate for the warp preventing supporting material.

Second Embodiment

In a second embodiment, an example is shown in which the wiring sheet is configured by a stacked body of a plurality of the thermoplastic resin sheets.

Figure 7:
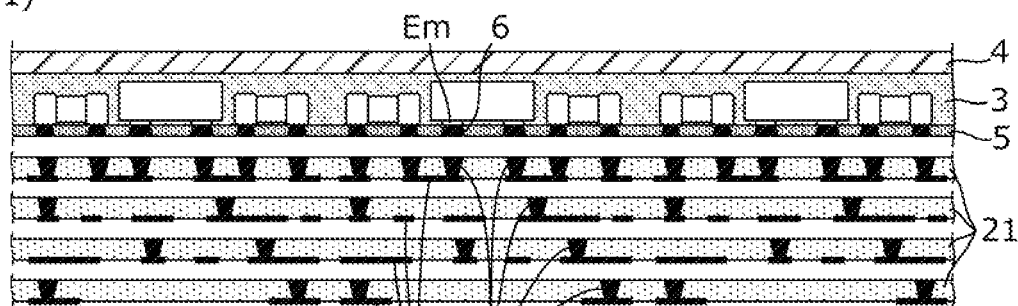
FIGS. 7(1)-7(4) are cross-sectional views of a substrate and each layer in a predetermined step of the method for manufacturing the module component according to a second embodiment.
Figure 7:
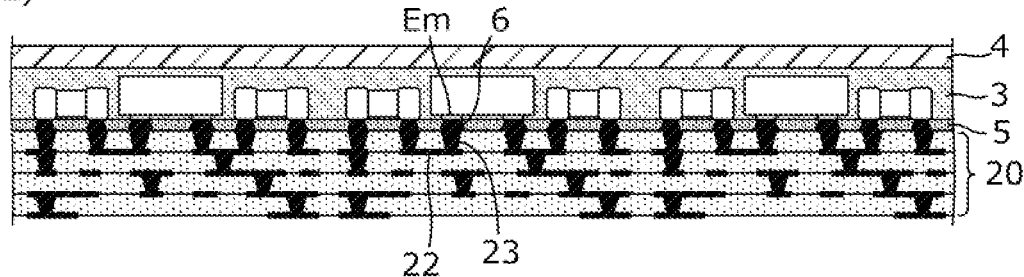
Figure 7:
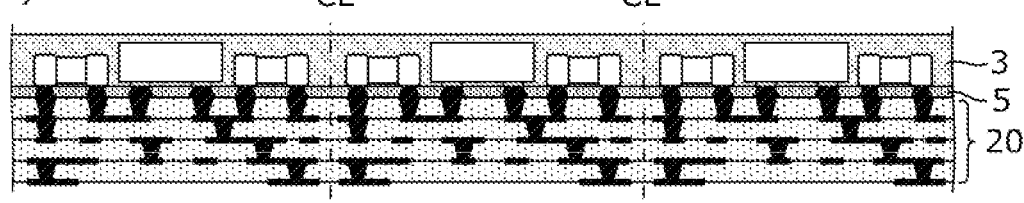
Figure 7:
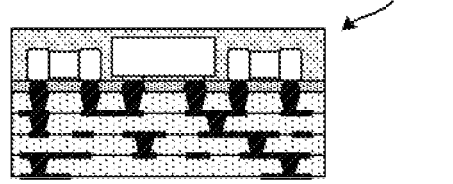

FIGS. 7(1)-7(4) are cross-sectional views of a substrate and each layer in a predetermined step of the method for manufacturing a module component according to the second embodiment. The figure shows the step of joining the wiring sheet 20 to the resin layer 3 through the intermediate auxiliary layer 5, and the subsequent steps thereof. The steps before the steps shown in FIG. 7(1) are as shown in FIGS. 1(1) through 2(7) of the first embodiment.

As shown in FIGS. 7(1) and 7(2) of, a plurality of thermoplastic resin sheets 21 are overlapped with (placed in an overlapping positon with) the surface of the resin layer 3 on top of which the intermediate auxiliary layer 5 has been placed and heating and pressurizing are performed (heat treatment is performed), whereby the thermoplastic resin sheets 21 of the wiring sheet 20 are fused to the intermediate auxiliary layer 5. Although the via pattern 23 of the wiring sheet 20 before the heat treatment is in an unmetallized state, the via pattern 23 is metallized by the heat treatment, and the mounting terminal Em of each component and the electrode pattern 22 are connected through the metal material 6 and the via pattern 23. The method for forming the electrode pattern 22 and the via pattern 23 with respect to each thermoplastic resin is as described in the first embodiment.

Thereafter, as shown in FIGS. 7(3) and 7(4), the warp preventing supporting material 4 is peeled off from the resin layer 3 and cutting along a cut lines CL is performed to form individual module components 102.

Figure 8:
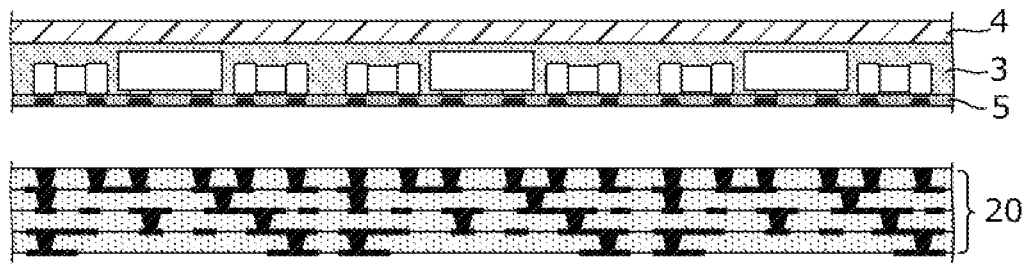
FIGS. 8(1)-8(4) are cross-sectional views of the substrate and each layer in a predetermined step of the method for manufacturing another module component according to the second embodiment.
Figure 8:
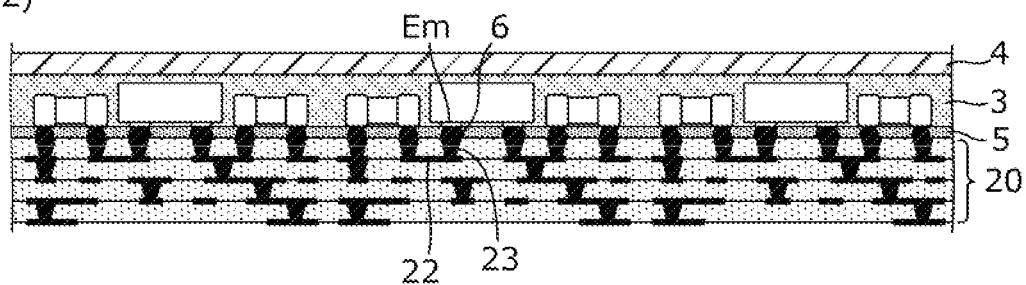
Figure 8:
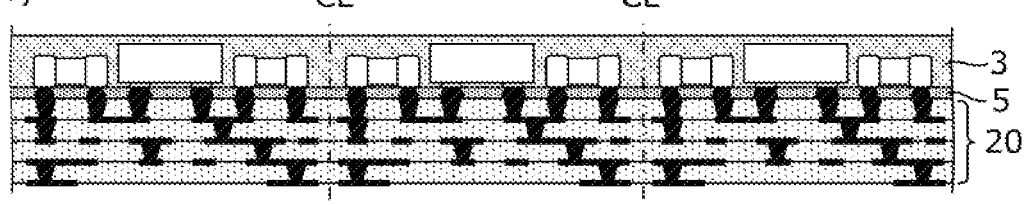
Figure 8:
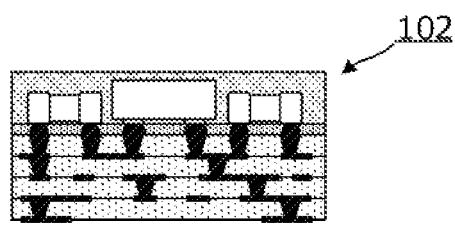

FIGS. 8(1)-(4) are cross-sectional views of the substrate and each layer in a predetermined step of the method for manufacturing another module component according to the present embodiment. The configuration of the wiring sheet 20 is different from that of the example shown in FIG. 7. In this example, the wiring sheet 20 is a stacked body comprising a plurality of thermoplastic resin sheets. The wiring sheet 20 in its stacked body state is overlapped with the surface of the resin layer 3 that is provided with the intermediate auxiliary layer 5 and heating and pressurizing are performed to fuse the wiring sheet 20 to the intermediate auxiliary layer 5. The subsequent steps are the same as the steps shown in FIGS. 7(2), 7(3) and 7(4).

According to this embodiment, the stacked body of the plurality of thermoplastic resin sheets can be easily formed with a small number of steps on the resin layer including the plurality of surface mounting components. Various surface mounting components may be built in the wiring sheet 20 in the stacked state.

Third Embodiment

In a third embodiment, an example in which the configuration of the metal material formed in the openings H of the intermediate auxiliary layer 5 is different from that in the first and second embodiments is shown.

Figure 9:
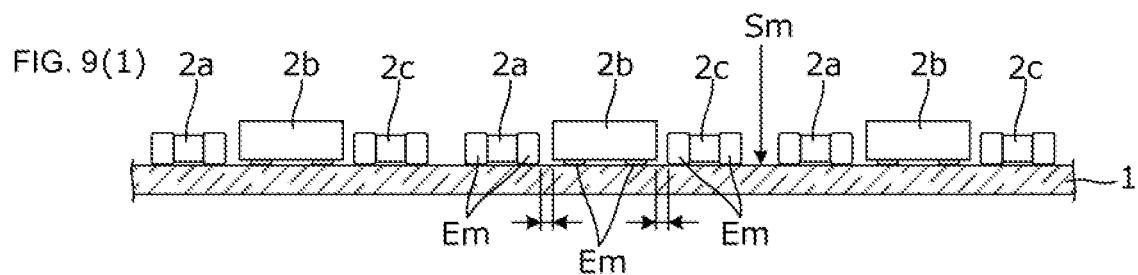
FIGS. 9(1)-11(11) are cross-sectional views of a substrate and each layer in each step of the method for manufacturing the module component according to a third embodiment.
Figure 9:
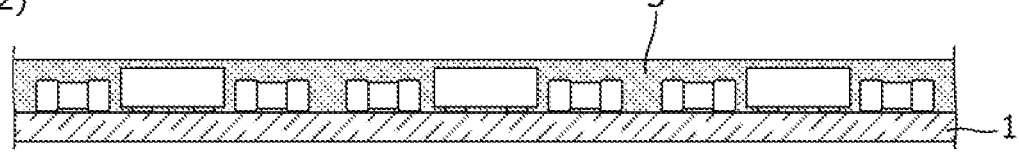
Figure 9:
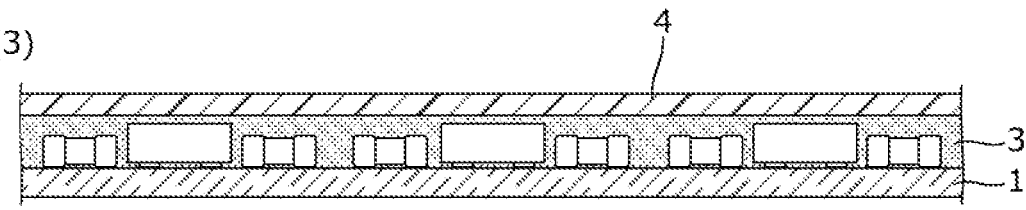
Figure 9:
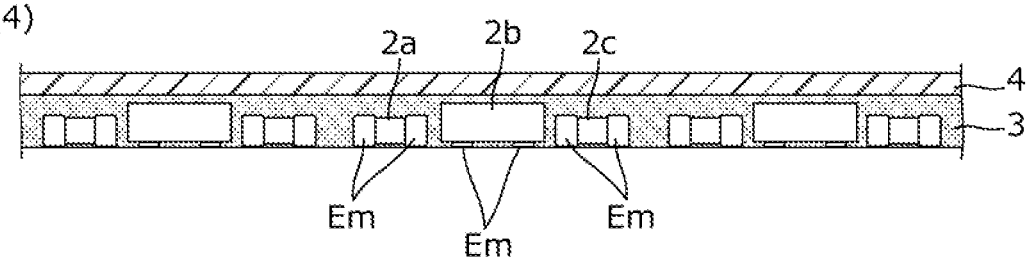

FIGS. 9(1) through 11(11) are cross-sectional views of a substrate and each layer in each step of the method for manufacturing the module component according to the third embodiment.

Figure 10:
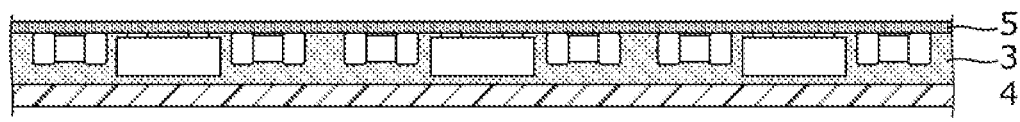
Figure 10:
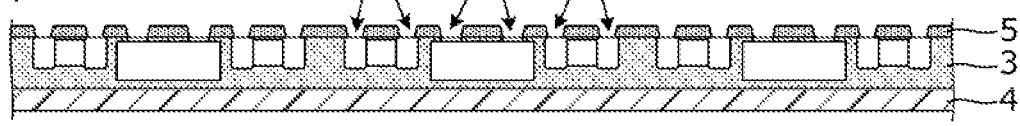
Figure 10:
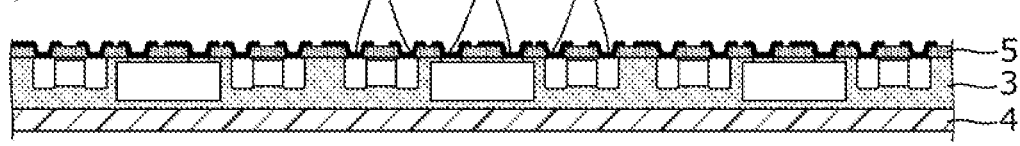

The steps shown in FIGS. 9(1)-9(4) and the steps shown in FIGS. 10(5) and 10(6) are the same as the steps shown in FIGS. 1(1)-1(4) and FIGS. 2(5) and 2(6) of the first embodiment. That is, [Surface mounting component burying step] [Warp preventing supporting material attaching step] and [Transfer substrate peeling step] are as shown in the first embodiment.

In the [Intermediate auxiliary layer processing step] of the present embodiment, a thin film of metal material 6 is formed in the openings H of the intermediate auxiliary layer 5, as shown in FIG. 10(7). For example, a Cu film can be formed on the entire surface of the intermediate auxiliary layer 5 by sputtering and etching is performed on the portions other than the openings H. By way of further example, sputtering can be performed using a mask pattern.

Figure 11:
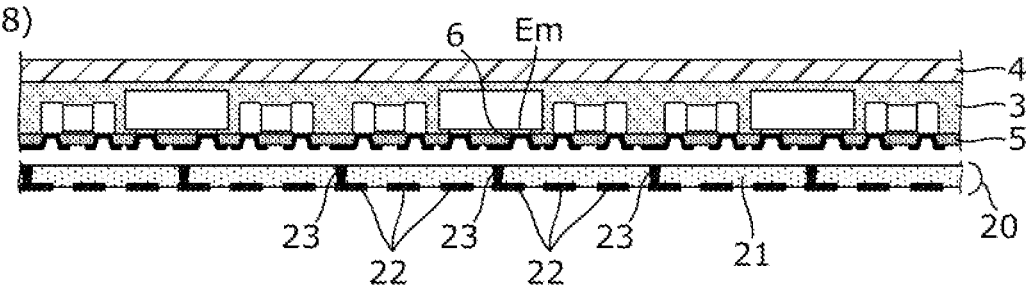
Figure 11:
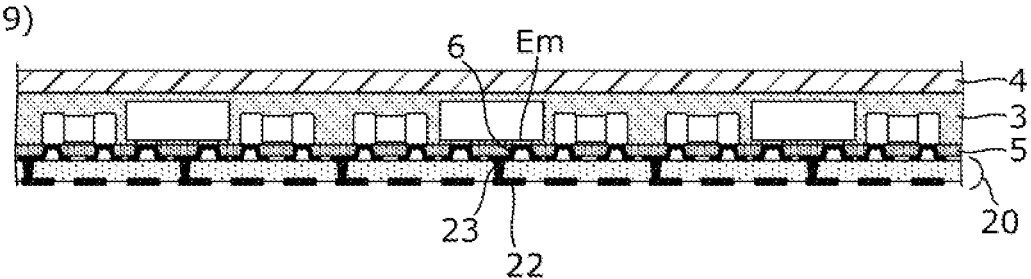
Figure 11:
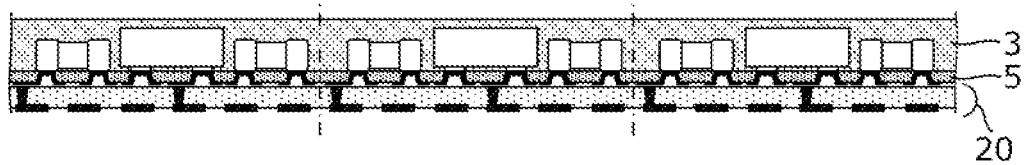
Figure 11:
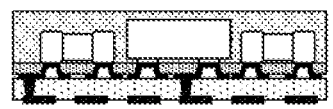

In the [Wiring sheet joining step], the wiring sheet 20 is overlapped with the surface provided with the intermediate auxiliary layer 5, as shown in FIGS. 11(8) and 11(9). The wiring sheet 20 is a sheet in which an electrode pattern 22 and a via pattern 23 are formed on or in the thermoplastic resin sheet 21. The manufacturing method for the wiring sheet 20 is as described in the first embodiment. However, the via pattern 23 is formed at a position to be connected to a flat portion of the metal material 6.

The thermoplastic resin sheet 21 of the wiring sheet 20 is preferably fused to the intermediate auxiliary layer 5 by overlapping the wiring sheet 20 with the intermediate auxiliary layer 5 and performing heating and pressurizing (heat treatment). Although the via pattern 23 of the wiring sheet 20 before the heat treatment is in an unmetallized state, the via pattern 23 is metallized by the heat treatment, and the mounting terminal Em of each component and the electrode pattern 22 are connected through the metal material 6 and the via pattern 23.

Figure 12:
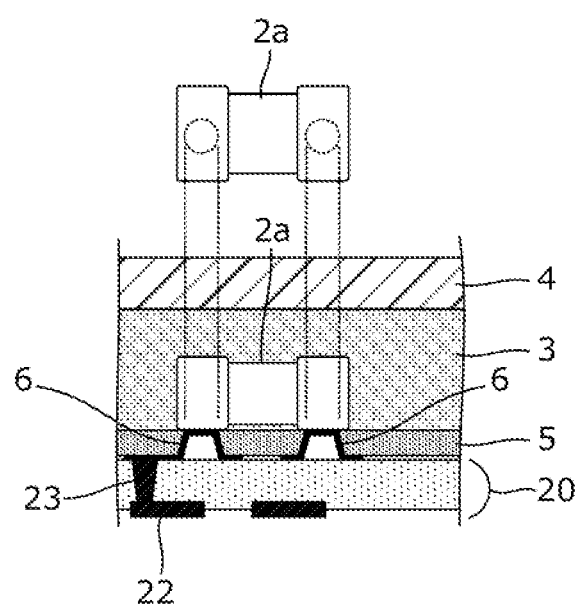
FIG. 12 is an enlarged cross-sectional view of a joining portion between the metal material 6 and a surface mounting component 2a according to the third embodiment.

FIG. 12 is an enlarged cross-sectional view of a joining portion between the metal material 6 and the surface mounting component 2a and a plan view of the surface mounting component 2a. The width (the horizontal direction in FIG. 12) of the metal material 6 is smaller than the width of the mounting terminal of the surface mounting component 2a. In this example, the portion where the metal material 6 makes contact with the mounting terminal of the surface mounting component 2a is circular, for example, as shown in FIG. 12. Therefore, even if there is some error in the position of the opening H formed in the intermediate auxiliary layer 5, the joining area between the mounting terminal of the surface mounting component 2a and the metal material 6 is maintained constant, and thus the manufacturing of the module component of ultra-high density mounting is facilitated.

Thereafter, as shown in FIGS. 11(9)-11(11), the warp preventing supporting material 4 is peeled off from the resin layer 3, and division into individual module components 103 is performed.

FIGS. 13(1)-13(3) are cross-sectional views of a substrate and each layer in a predetermined step of the method for manufacturing another module component according to the present embodiment. These figures are views corresponding to each step shown in FIGS. 11(8)-11(11). In the steps shown in FIGS. 11(8)-11(11), the wiring sheet 20 is overlapped with the resin layer 3 while the warp preventing supporting material 4 is attached to the resin layer 3. However, the wiring sheet 20 may be overlapped with the resin layer while the warp preventing supporting material is not attached to the resin layer 3, as shown in FIG. 13(2).

According to the present embodiment, the via pattern 23 formed in the wiring sheet 20 is connected to the flat portion of the metal material 6 and not to the positions of the openings H (see FIG. 10(6)) of the intermediate auxiliary layer 5 and therefor the stress applied to the connecting portion of the mounting terminals of the surface mounting components 2a, 2b, 2c is relaxed and the connection reliability is easily improved.

Fourth Embodiment

In a fourth embodiment, a method for manufacturing a module component in which an electrode for shielding is formed on a warp preventing supporting material is described.

Figure 14:
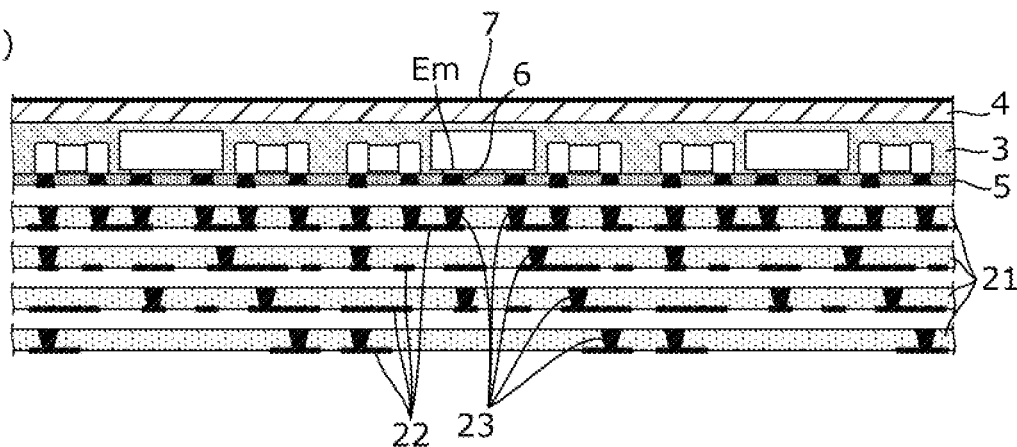
FIGS. 14(1)-14(3) are cross-sectional views of a substrate and each layer in a predetermined step of the method for manufacturing the module component according to a fourth embodiment.
Figure 14:
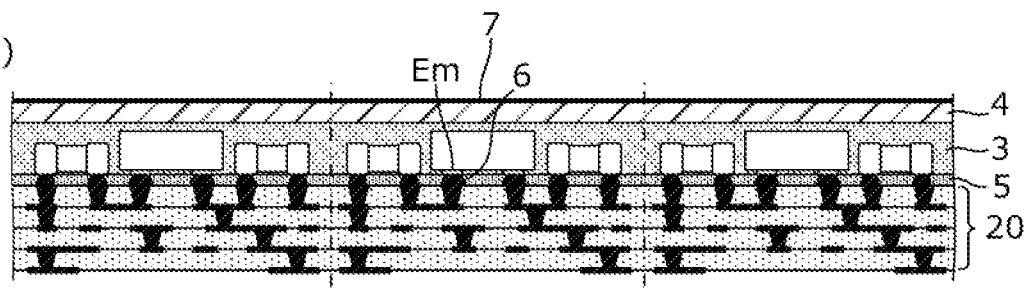
Figure 14:
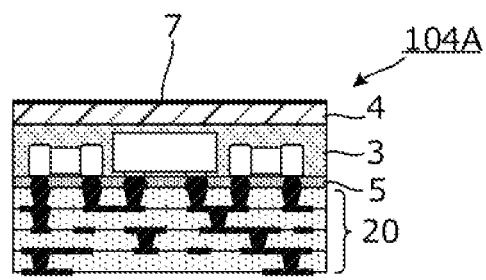

FIGS. 14(1)-14(3) are cross-sectional views of a substrate and each layer in a predetermined step of the method for manufacturing a module component according to the present embodiment. The figures show the step of joining the wiring sheet 20 to the resin layer 3 through the intermediate auxiliary layer 5 and the subsequent step thereof. The steps before that shown in FIG. 14(1) are those shown in FIGS. 1(1)-2(7) of the first embodiment.

A shield electrode 7 is formed in advance on substantially the entire surface of the warp preventing supporting material 4. The warp preventing supporting material 4 can be, for example, a Si substrate and the shield electrode 7 can be a Cu film formed by sputtering, for example, on the surface of the Si substrate.

As shown in FIGS. 14(1) and 14(2), a plurality of thermoplastic resin sheets 21 are overlapped with the surface of the resin layer 3 that is provided with the intermediate auxiliary layer 5, and heating and pressurizing are performed (heat treatment is performed), whereby the thermoplastic resin sheets 21 of the wiring sheet 20 are fused to the intermediate auxiliary layer 5. The via pattern 23 is metallized by the heat treatment, and the mounting terminal Em of each component and the electrode pattern 22 are connected through the metal material 6 and the via pattern 23. The method for forming the electrode pattern 22 and the via pattern 23 with respect to each thermoplastic resin is as described in the first embodiment.

Thereafter, as shown in FIGS. 14(2) and 14(3), division into individual module components 104A is performed by using a dicer or the like without peeling the warp preventing supporting material 4 from the resin layer 3.

According to the present embodiment, a module component in which the shield electrode 7 is formed on the surface is obtained.

Figure 15:
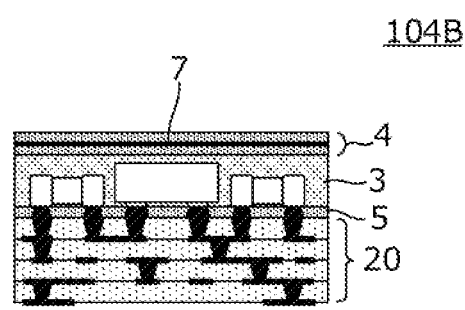
FIG. 15 is a cross-sectional view of another module component 104B according to the fourth embodiment.

FIG. 15 is a cross-sectional view of another module component 104B according to the present embodiment. In this example, the shield electrode 7 is formed on an inner layer of the warp preventing supporting material 4. The warp preventing supporting material 4 is, for example, a stacked body of a plurality of thermoplastic resin sheets, and the shield electrode 7 is, for example, a Cu foil.

According to the present embodiment, a module component in which internal parts and circuits are shielded is obtained. In addition, as shown in FIG. 15, when a thermoplastic resin sheet is used as the warp preventing supporting material 4, the attachment of the warp preventing supporting material 4 to the resin layer 3 is facilitated.

Fifth Embodiment

In a fifth embodiment, a method for manufacturing a module component including an electrode for shielding that surrounds the surface mounting component is described.

Figure 16:
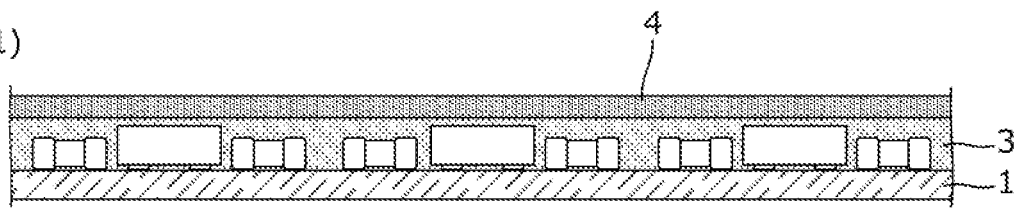
FIGS. 16(1)-17(6) are cross-sectional views of the substrate and each layer in each step of the method for manufacturing the module component according to a fifth embodiment.
Figure 16:
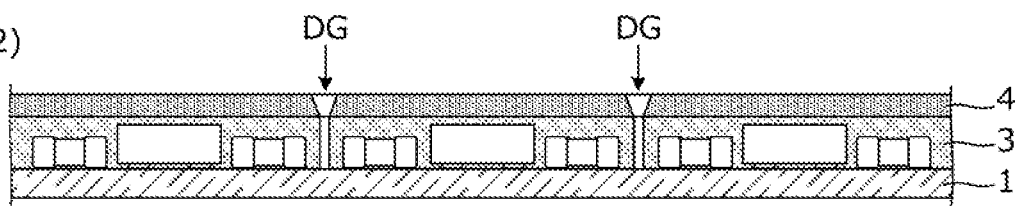
Figure 16:
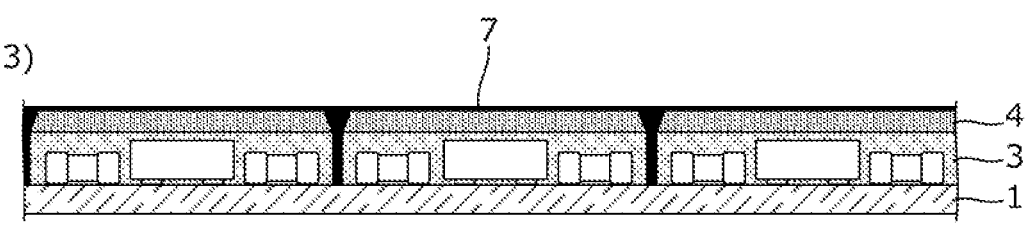
Figure 16:
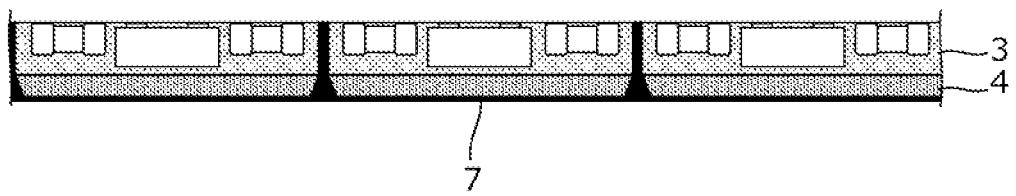

FIGS. 16(1) through 17(6) are cross-sectional views of a substrate and each layer in a predetermined step of the method for manufacturing a module component according to the present embodiment. FIG. 16(1) corresponds to the FIG. 1(3) of the first embodiment. In other words, it is a state in which the [Surface mounting component arranging step], [Surface mounting component burying step], and [Warp preventing supporting material attaching step] are completed. Here, the warp preventing supporting material 4 is a sheet of high workability such as a thermoplastic resin, for example.

After the above step, a deep groove DG is formed at the boundary of the module components adjacent to each other, as shown in FIG. 16(2).

Thereafter, as shown in FIG. 16(3), the shield electrode 7 is formed on the surface of the warp preventing supporting material 4 and in the deep groove DG. For example, a conductive paste is applied and formed.

Figure 17:
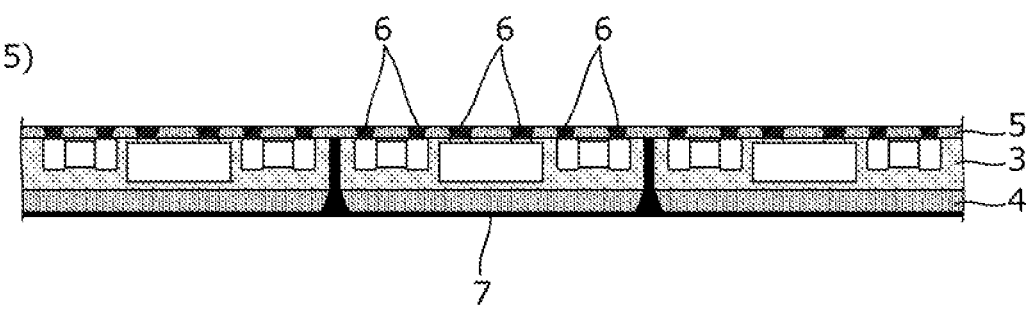
Figure 17:
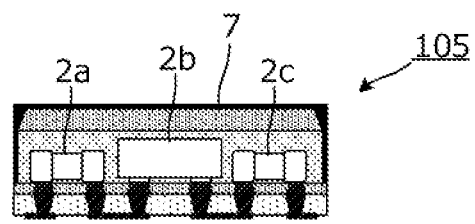

Thereafter, as shown in FIG. 16(4), the transfer substrate 1 is peeled off, and the steps similar to the steps shown in FIGS. 2(5)-2(7) are performed. Thus, a state in which the intermediate auxiliary layer 5 having the metal material 6 filled at a predetermined position is arranged is obtained, as shown in FIG. 17(5).

Thereafter, the steps similar to the steps shown in FIG. 3 are performed. A module component 105 as shown in (6) of FIG. 17 is thereby obtained.

According to the present embodiment, a module component in which the periphery of the surface mounting components 2a, 2b, 2c is surrounded by the shield electrode 7 is obtained.

Other Embodiments

In some embodiments, an example using the thermoplastic resin sheet 21 on one side of which a Cu foil 22P is laminated is shown, but a thermoplastic resin sheet on each side of which a metal foil is laminated may be used.

Furthermore, the wiring sheet 20 may be a stacked body of thermoplastic resin sheets, and components may be built in the wiring sheet 20.

Moreover, in individualization, scribe lines may be formed by laser processing other than cutting with a dicer.

Finally, the description of the above embodiments is illustrative in all respects, and is not to be restrictive. Variations and modifications can be appropriately made by those skilled in the art. The scope of the present invention is indicated not by the above-described embodiments but by the claims. Furthermore, the scope of the present invention includes modifications from the embodiments within the scope equivalent to the scope of the claims.

What is claimed is:

1. A method for manufacturing a module component comprising:
   arranging a plurality of surface mounting components on a component mounting surface of a transfer substrate, each of the surface mounting components have a mounting terminal facing the component mounting surface of the transfer substrate;
   forming a resin layer on the component mounting surface of the transfer substrate and burying the plurality of surface mounting components in the resin layer;
   peeling the resin layer from the transfer substrate, with the surface mounting components buried in the resin layer, to expose a surface of the resin layer;
   forming an intermediate auxiliary layer on the exposed surface of the resin layer, the intermediate auxiliary layer including openings for exposing the mounting terminals and having metal materials arranged in the openings; and
   joining a wiring sheet including a thermoplastic resin sheet with a plurality of unmetallized via patterns and an electrode pattern connected to the via patterns to the intermediate auxiliary layer such that each of the via patterns aligns with a respective one of the openings in the intermediate auxiliary layer and performing heat treatment to (a) fuse the thermoplastic resin sheet to the intermediate auxiliary layer, (b) metallize the via patterns, and (c) cause end portions of the metal materials to extend into the metallized via patterns and be arranged in recesses formed in the metallized via patterns so as to electrically connect the mounting terminals and the electrode pattern.

2. The method for manufacturing the module component according to claim 1, wherein the intermediate auxiliary layer is a layer of thermoplastic resin.

3. The method for manufacturing the module component according to claim 2, wherein:
   the metal materials are a material having copper as a main component; and
   the via patterns in the unmetallized state are a metal material capable of forming an intermetallic compound with copper.

4. The method for manufacturing the module component according to claim 1, wherein:
   the metal materials are a material having copper as a main component; and
   the via patterns in the unmetallized state are a metal material capable of forming an intermetallic compound with copper.

5. The method for manufacturing the module component according to claim 1, wherein the thermoplastic resin sheet includes a plurality of thermoplastic resin sheets which are stacked to configure the wiring sheet.

6. The method for manufacturing the module component according to claim 1, wherein:
   the transfer substrate, the resin layer, the intermediate auxiliary layer, and the wiring sheet include a plurality of module component forming regions; and
   the method further includes separating a module component aggregate formed in accordance with claim 1 into individual modules.

7. The method for manufacturing the module component according to claim 1, further comprising attaching a warp preventing supporting material to a surface of the resin layer before the resin layer is peeled from the transfer substrate.

8. The method for manufacturing the module component according to claim 7, wherein the warp preventing supporting material is a thermoplastic resin sheet.

9. The method for manufacturing the module component according to claim 7, wherein the warp preventing supporting material is an Si substrate.

10. The method for manufacturing the module component according to claim 7, further comprising providing the warp preventing supporting material with an electrode for shielding before the warp preventing supporting material is attached to the surface of the resin layer.

11. The method for manufacturing the module component according to claim 7, further comprising peeling the warp preventing supporting material from the resin layer after the wiring sheet has been joined to the intermediate auxiliary layer.

12. The method for manufacturing the module component according to claim 1, wherein the via patterns and the metal materials are joined by transient liquid phase diffusion.

13. The method for manufacturing the module component according to claim 1, wherein:
   the wiring sheet is planar;
   each of the via patterns aligns with a respective opening in the intermediate auxiliary layer; and
   the width of each metallized via pattern, as measured along the plane of the wiring sheet, is larger than the width, as measured along the plane of the wiring sheet, of the metal material located in the opening in the intermediate auxiliary layer with which it is aligned.

* * * * *